United States Patent
Iwai et al.

(10) Patent No.: US 10,431,528 B2
(45) Date of Patent: Oct. 1, 2019

(54) SEMICONDUCTOR DEVICE

(71) Applicant: Mitsubishi Electric Corporation, Tokyo (JP)

(72) Inventors: Takamasa Iwai, Tokyo (JP); Satoshi Kondo, Tokyo (JP); Hiroshi Kawashima, Tokyo (JP); Junji Fujino, Tokyo (JP); Ken Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/070,352

(22) PCT Filed: Feb. 8, 2016

(86) PCT No.: PCT/JP2016/053671
§ 371 (c)(1),
(2) Date: Jul. 16, 2018

(87) PCT Pub. No.: WO2017/138072
PCT Pub. Date: Aug. 17, 2017

(65) Prior Publication Data
US 2019/0043788 A1 Feb. 7, 2019

(51) Int. Cl.
*H01L 23/495* (2006.01)

(52) U.S. Cl.
CPC .. *H01L 23/49524* (2013.01); *H01L 23/49541* (2013.01); *H01L 23/49544* (2013.01); *H01L 23/49551* (2013.01); *H01L 23/49575* (2013.01); *H01L 23/49582* (2013.01); *H01L 2224/48091* (2013.01); *H01L 2224/48137* (2013.01); *H01L 2224/48472* (2013.01); *H01L 2224/73265* (2013.01); *H01L 2924/181* (2013.01)

(58) Field of Classification Search
CPC .......... H01L 23/49551; H01L 23/4951; H01L 23/49503
See application file for complete search history.

(56) References Cited

U.S. PATENT DOCUMENTS

| 7,633,143 B1 * | 12/2009 | Fan ................... H01L 23/49503 257/666 |
| 8,952,508 B2 * | 2/2015 | Miyake ............. H01L 23/49551 174/126.1 |
| 2018/0286702 A1 * | 10/2018 | Kawashima ........ H01L 21/4825 |

FOREIGN PATENT DOCUMENTS

| JP | H04-346257 A | 12/1992 |
| JP | 2006-186132 A | 7/2006 |

OTHER PUBLICATIONS

International Search Report issued in PCT/JP2016/053671; dated Mar. 22, 2016.

* cited by examiner

*Primary Examiner* — Yu-Hsi D Sun
(74) *Attorney, Agent, or Firm* — Studebaker & Brackett PC (57) ABSTRACT

A leadframe of a semiconductor device includes a die pad, first and second suspension leads, and a frame. The main surfaces of the die pad and the frame are located on different planes, and the die pad and the frame are connected to each other by the first and second suspension leads. A first boundary line between the first suspension lead and the die pad runs on a straight line different from a second boundary line between the second suspension lead and the die pad. A third boundary line between the first suspension lead and the frame runs on a straight line different from a fourth boundary line between the second suspension lead and the frame.

8 Claims, 10 Drawing Sheets

SEMICONDUCTOR DEVICE

TECHNICAL FIELD

The present invention relates to semiconductor devices, and particularly, to a semiconductor device including a leadframe including a die pad for mounting a semiconductor device thereon.

BACKGROUND ART

In the formation of a semiconductor device, a leadframe and a semiconductor element are electrically connected to each other, and the leadframe and the semiconductor element are or a plurality of semiconductor elements are electrically connected to each other by a wire material (member), followed by sealing with molding resin. The leadframe may be any of leadframes having various shapes and materials depending on applications.

In such a semiconductor device, however, the occurrence of a phenomenon called a die pad shift is known. In the die pad shift, a die pad of a leadframe on which a semiconductor element is mounted experiences a flow resistance of a molding resin and accordingly shifts from its original position in resin sealing. The occurrence of a die pad shift may expose a wire material, the semiconductor element, and the die pad from a region sealed with resin. To address this problem, the occurrence of a die pad shift is preferably prevented or reduced.

The rigidity of a suspension lead supporting a die pad is preferably increased in order to prevent or reduce the occurrence of a die pad shift. From this perspective, for example, Japanese Patent Laying-Open No. 2006-186132 (PTD1) discloses a technology of providing a V-shaped trench in part of a suspension lead to increase its rigidity.

CITATION LIST

Patent Document

PTD 1: Japanese Patent Laying-Open No. 2006-186132

SUMMARY OF INVENTION

Technical Problem

In the use of the structure disclosed in PTD1, the rigidity of a suspension lead can certainly be increased. It is however difficult to prevent or reduce a die pad shift when the structure of PTD1 is applied to a leadframe having a configuration in which a suspension lead is connected from only one side of a die pad.

The present invention has been made in view of the above problem, and therefore has an object to provide a semiconductor device capable of more reliably preventing or reducing a die pad shift of a leadframe.

Solution to Problem

A semiconductor device of the present invention includes a semiconductor element and a leadframe. The leadframe mounts the semiconductor element thereon. The leadframe includes a die pad on which the semiconductor element is mounted, a first suspension lead, a second suspension lead, and a frame. The main surface of the die pad and the main surface of the frame are positioned on different planes, and the die pad and the frame are connected to each other by the first and second suspension leads. A first boundary line between the first suspension lead and the die pad runs on a straight line different from a second boundary line between the second suspension lead and the die pad. A third boundary line between the first suspension lead and the frame runs on a straight line different from a fourth boundary line between the second suspension lead and the frame.

Advantageous Effects of Invention

According to the present invention, the rigidity of the suspension lead can be increased by the first boundary line running on the straight line different from the second boundary line and the third boundary line running on the straight line different from the fourth boundary line, more reliably preventing or reducing a die pad shift.

DESCRIPTION OF EMBODIMENTS

Embodiments of the present invention will be described below with reference to the drawings.

Embodiment 1

Figure 1:
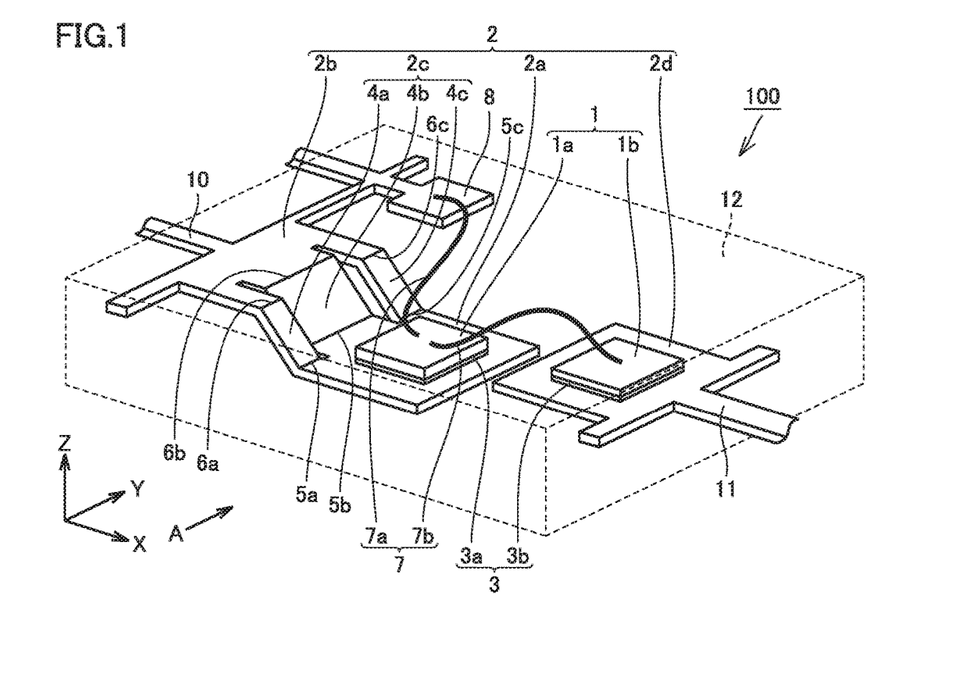
FIG. 1 is a schematic perspective view of a general arrangement of a semiconductor device of the present embodiment.

A configuration of a semiconductor device of the present embodiment will be described first with reference to FIG. 1. For the sake of description, the X direction, Y direction, and Z direction are introduced. With reference to FIG. 1, a semiconductor device 100 of the present embodiment is configured such that a leadframe on which a semiconductor element is mounted is sealed with molding resin. Specifically, semiconductor device 100 includes a semiconductor element 1 and a leadframe 2 as main components.

In FIG. 1, semiconductor element 1 includes a semiconductor element 1a and a semiconductor element 1b. In FIG. 1, leadframe 2 includes a leadframe member including a die pad 2a, a frame 2b, and a suspension lead 2c, and a leadframe member including an independent frame 2d. These leadframe members are spaced from each other.

Die pad 2a is a region of leadframe 2 in which semiconductor element 1 is mounted. In FIG. 1, semiconductor element 1a is electrically connected to die pad 2a with a conductive adhesive 3a.

Frame 2b is a region arranged outermost in the entire leadframe 2 when viewed in plan view. Since frame 2b is integrated with die pad 2a, semiconductor element 1 is not mounted on frame 2b. However, semiconductor element 1b is electrically connected to independent frame 2d with a conductive adhesive 3b. Independent frame 2d is arranged independently of die pad 2a or the like and is separate from frame 2b. A frame portion (a frame portion remaining after the leadframe is cut) in the Z direction of FIG. 1 may be provided in frame 2b and independent frame 2d.

In leadframe 2, suspension lead 2c is a region connecting die pad 2a and frame 2b and is arranged between die pad 2a and frame 2b. In other words, in leadframe 2, die pad 2a, suspension lead 2c, and frame 2b are arranged to be disposed in the X direction in the stated order.

Suspension lead 2c is divided into three regions, namely, a suspension lead 4a, a suspension lead 4b, and a suspension lead 4c, and these regions are arranged to be disposed in the Z direction in the stated order. Suspension lead 4a of suspension lead 2c and die pad 2a are connected to each other by a boundary line 5a, suspension lead 4b of suspension lead 2c and die pad 2a are connected to each other by a boundary line 5b, and suspension lead 4c of suspension lead 2c and die pad 2a are connected to each other by a boundary line 5c. Suspension lead 4a and frame 2b are connected to each other by a boundary line 6a, suspension lead 4b and frame 2b are connected to each other by a boundary line 6b, and suspension lead 4c and frame 2b are connected to each other by a boundary line 6c. Boundary lines 5a to 5c and 6a to 6c run in the Y direction.

Additionally, semiconductor device 100 of FIG. 1 includes a wire material 7 for electrically connecting the respective regions and, in FIG. 1, includes a wire material 7a and a wire material 7b as wire material 7. A terminal (not shown), an electrode (not shown), or the like mounted on semiconductor element 1a and, for example, a terminal 8 are electrically connected to each other by wire material 7a. Herein, terminal 8 is spaced from, for example, frame 2b on the XY plane and is arranged at a position with a coordinate substantially equal to that of frame 2b in the Z direction. The terminal (not shown), electrode (not shown), and the like mounted on semiconductor element 1a are electrically connected to a terminal (not shown), an electrode (not shown), and the like mounted on semiconductor element 1b by wire material 7b.

Connected to frame 2b of the leadframe member including die pad 2a, frame 2b, and suspension lead 2c is a lead 10. Lead 10 electrically connects frame 2b (semiconductor element 1a) and the outside of semiconductor device 100. Connected to independent frame 2d of the leadframe member including independent frame 2d is a lead 11. Lead 11 electrically connects independent frame 2d (semiconductor element 1b) and the outside of semiconductor device 100.

Leadframe 2 on which semiconductor elements 1a and 1b are mounted as described above is sealed with a molding resin 12. In FIG. 1, molding resin 12 is indicated by a dotted line for focusing on leadframe 2 and the like inside the region sealed with molding resin 12.

Figure 2:
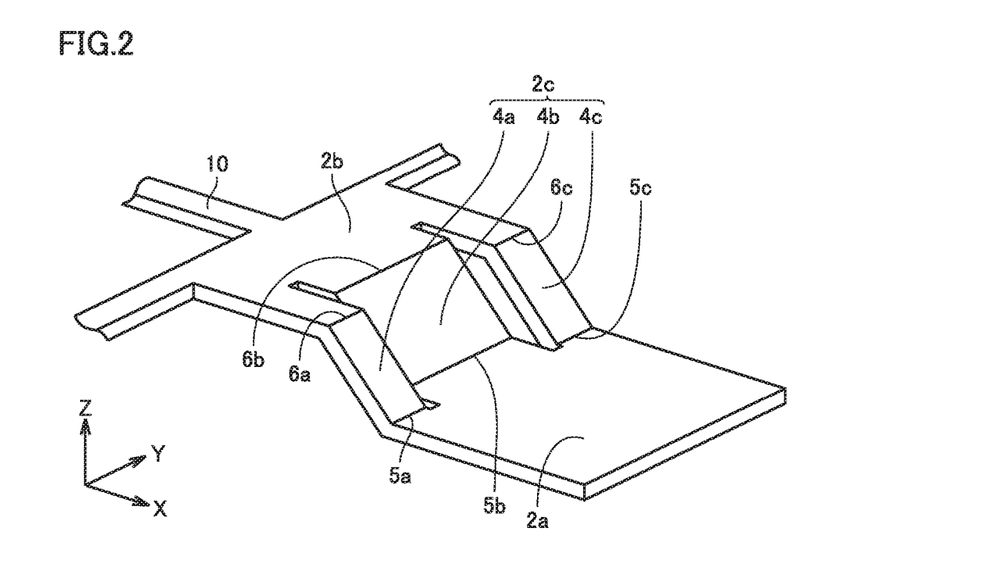
FIG. 2 is a schematic perspective view of a configuration of a leadframe of Embodiment 1.
Figure 3:
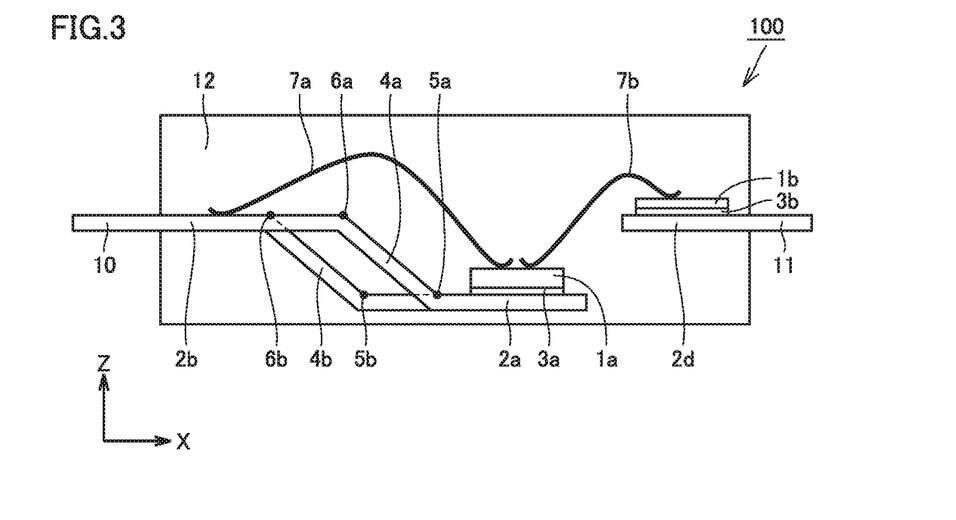
FIG. 3 is a front view of a general arrangement of the semiconductor device of Embodiment 1.

Leadframe 2 included in semiconductor device 100 of the present embodiment will now be described in more detail with reference to FIGS. 2 and 3. FIG. 2 shows the leadframe member composed of die pad 2a, frame 2b, and suspension lead 2c in FIG. 1 in an enlarged manner compared with FIG. 1. FIG. 3 shows semiconductor device 100 of the present embodiment including the portion sealed with molding resin 12, which is seen through from a direction A indicated by the arrow in FIG. 1.

With reference to FIGS. 2 and 3, in the leadframe member including die pad 2a and the like of leadframe 2 of semiconductor device 100 of the present embodiment, die pad 2a and frame 2b each have, for example, a rectangular plate shape in plan view. In this leadframe member, suspension lead 2c and frame 2b are located only at one side of the main surface of die pad 2a. Herein, "one side" means a negative side in the X direction in FIG. 1. In other words, suspension lead 2c and frame 2b are arranged at the negative side (rear side) in the X direction of die pad 2a which is rectangular in plan view. However, suspension lead 2c and frame 2b are not arranged at the other three sides of the rectangular shape of die pad 2a, that is, the positive side (front side) in the X direction and two sides in the Y direction.

The leadframe member is originally a single plate-shaped member including die pad 2a, suspension lead 2c, and frame 2b. This single member is bent so as to project downwardly in the Z direction in FIGS. 2 and 3 at boundary lines 5a, 5b, and 5c connecting suspension lead 2c and die pad 2a, and is bent so as to project upwardly in the Z direction in FIGS. 2 and 3 at boundary lines 6a. 6b, and 6c connecting suspension lead 2c and frame 2b. In the formation of the member of leadframe 2 as shown in FIG. 2 by bending a single plate-shaped member in this manner, the plate-shaped member is preferably pressed.

Such pressing causes the main surface of die pad 2a of leadframe 2 and the main surface of frame 2b of leadframe 2 to be located on different planes. In other words, the main surface of frame 2b is located at a higher level in the Z direction than the main surface of die pad 2a, and a level difference is formed between die pad 2a and frame 2b. It should be noted that the main surface of frame 2b is substantially parallel to the main surface of die pad 2a, and both the main surfaces extend so as to lie along the XY plane. Frame 2b is arranged at a higher level in the Z direction than die pad 2a because, due to the bending of the lead frame member at boundary lines 5a to 5c and boundary lines 6a to 6c, suspension lead 2c arranged between die pad 2a and frame 2b runs toward a higher level in the Z direction as closer to frame 2b.

Suspension lead 2c is divided into three regions, namely, suspension lead 4a, suspension lead 4b, and suspension lead 4c in the present embodiment as described above, and a spacing is left slightly between suspension leads 4a, 4b, and 4c in the Y direction. The dimension of this spacing in the Y direction is preferably substantially equal to, for example, the thickness of frame 2b. The presence of this spacing enables a material to be easily bent in pressing for forming the shape of leadframe 2. Boundary line 5b (first boundary plane) between suspension lead 4b (first suspension lead) and die pad 2a runs on a straight line different from boundary line 5a (second boundary line) between suspension lead 4a (second suspension lead) and die pad 2a.

In other words, both of boundary line 5b and boundary line 5a are located on the main surface of die pad 2a (on the plane formed by the main surface of die pad 2a) and run on this main surface, and accordingly, these boundary lines are arranged on the same plane (on the plane along the XY plane). Boundary line 5b and boundary line 5a run parallel to each other so as to lie along the Y direction but are not arranged so as to lie on the same straight line. In other words, boundary line 5a is arranged at the positive side in the X direction (the front side in FIG. 2) compared with boundary line 5b, and boundary line 5a and boundary line 5b are spaced in parallel. Herein, "parallel" means a relationship of arrangement of two straight lines in which the two straight lines have a variation of 10 nm or less in the distance between boundary line 5b and boundary line 5a when they move 1 μm in the direction in which boundary line 5b and boundary line 5a run.

Similarly to the above, in the present embodiment, boundary line 6b (third boundary line) between suspension lead 4b (first suspension lead) and frame 2b runs on a straight line different from boundary line 6a (fourth boundary line) between suspension lead 4a (second suspension lead) and frame 2b. In other words, since both of boundary line 6b and boundary line 6a are located on the main surface of frame 2b (on the plane formed by the main surface of frame 2b) and run on the main surface, these boundary lines are arranged on the same plane (on the plane along the XY plane). Although boundary line 6b and boundary line 6a run parallel to each other so as to lie along the Y direction, they are not arranged on the same straight line; boundary line 6a is arranged at the positive side in the X direction compared with boundary line 6b.

Similarly, in the present embodiment, boundary line 5b (first boundary line) between suspension lead 4b (first suspension lead) and die pad 2a runs on a straight line different from boundary line 5c (fifth boundary line) between suspension lead 4c (third suspension lead) and die pad 2a. In other words, both of boundary line 5b and boundary line 5c are also located on the main surface of die pad 2a and also run parallel to each other so as to lie along the Y direction on the main surface. Boundary line 6b (third boundary line) between suspension lead 4b (first suspension lead) and frame 2b runs on a straight line different from boundary line 6c (sixth boundary line) between suspension lead 4c (third suspension lead) and frame 2b. In other words, similarly to the above, both of boundary line 6b and boundary line 6c are located on the main surface of frame 2b and run parallel to each other so as to lie along the Y direction on the main surface. Thus, boundary line 5c is arranged at the positive side (the front side in FIG. 2) in the X direction compared with boundary line 5b. Similarly, boundary line 6c is arranged at the positive side in the X direction compared with boundary line 6b.

As described above, in FIG. 2 of the present embodiment, suspension lead 4a and suspension lead 4c arranged at one side and the other side of suspension lead 4b in the Y direction are located at the positive side (front side) in the X direction compared with suspension lead 4b arranged at the center in the Y direction. In the present embodiment, boundary line 5a and boundary line 5c are arranged on substantially one straight line, and boundary line 6a and boundary line 6c are arranged so as to lie on substantially one straight line. Suspension lead 4a and suspension lead 4c are arranged so as to extend on substantially the same plane. However, the present invention is not limited to such a configuration. For example, boundary line 5a may be arranged at the side close to the front side in the X direction compared with boundary line 5c, or boundary line 5c may be arranged at the side close to the front side in the X direction compared with boundary line 5a.

In FIG. 2, the angle formed between the main surface of die pad 2a and the main surface of suspension lead 2c (suspension leads 4a, 4b, 4c) and the angle formed between the main surface of frame 2b and the main surface of suspension lead 2c (suspension leads 4a, 4b, 4c) are each greater than 90°. However, the present invention is not limited to such a configuration. For example, the above-mentioned angles may be 90° or may be smaller than 90°. In FIG. 2, the angle formed between the main surface of die pad 2a and the main surface of suspension lead 2c (suspension leads 4a, 4b, 4c) is substantially equal to the angle formed between the main surface of frame 2b and the main surface of suspension lead 2c (suspension leads 4a. 4b, 4c). However, these angles do not need to be equal to each other. For example, the angle formed between die pad 2a and suspension lead 4a may differ from the angle formed between die pad 2a and suspension lead 4c by 10° or more.

In FIG. 2 of the present embodiment, separate three suspension leads 4a, 4b, and 4c are equal to each other in the length in their extension direction. In other words, the length of suspension lead 4b in its extension direction as the distance between boundary line 5b and boundary line 6b is equal to the length of suspension lead 4a in its extension direction as the distance between boundary line 5a and boundary line 6a. Similarly, the length of suspension lead 4c in its extension direction as the distance between boundary line 5c and boundary line 6c is equal to the length of suspension lead 4a in its extension direction as the distance between boundary line 5a and boundary line 6a. Herein, "equal length" means that a deviation in the length is ±3% or less.

In FIG. 2, suspension lead 4a and suspension lead 4c are arranged to be bilaterally symmetrical with respect to suspension lead 4b in the central portion in the Y direction, and suspension lead 4a and suspension lead 4c have an equal dimension in the Y direction. In other words, boundary line 5a and boundary line 5c are equal in the length in the Y direction, and boundary line 6a and boundary line 6c are equal in the length in the Y direction. However, the present invention is not limited to such a manner. For example, boundary line 5a and boundary line 5c may differ in length, and boundary line 6a and boundary line 6c may differ in length. However, boundary line 5a and boundary line 6a are preferably equal in length, and boundary line 5c and boundary line 6c are preferably equal in length.

In FIG. 2, the dimension of suspension lead 4b in the Y direction which is located in the central portion in the Y direction is greater than the dimensions of suspension lead 4a and suspension lead 4c in the Y direction. However, the present invention is not limited to such a manner. For example, the dimension(s) of suspension lead 4a and/or suspension lead 4c in the Y direction may be greater than the dimension of suspension lead 4b in the Y direction.

Figure 4:
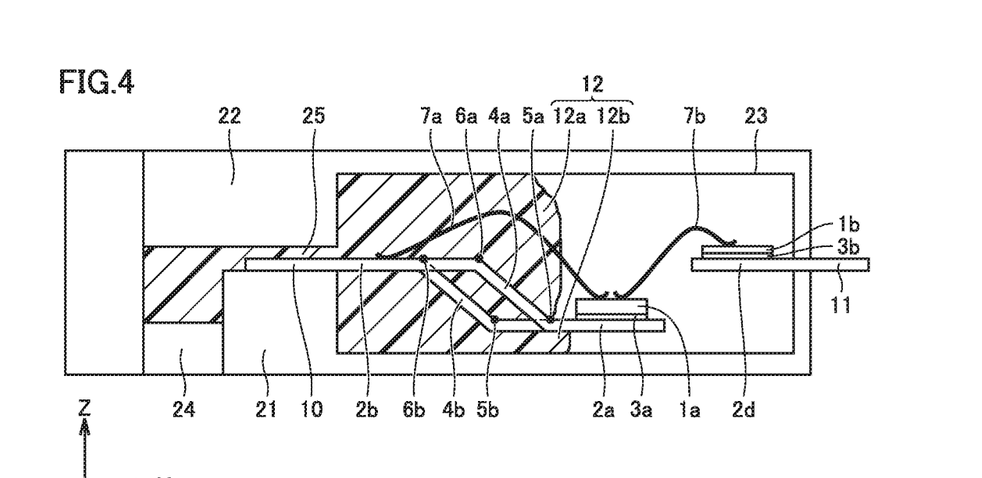
FIG. 4 is a front view showing a step of sealing components of the semiconductor device of Embodiment 1 by transfer molding.
Figure 5:
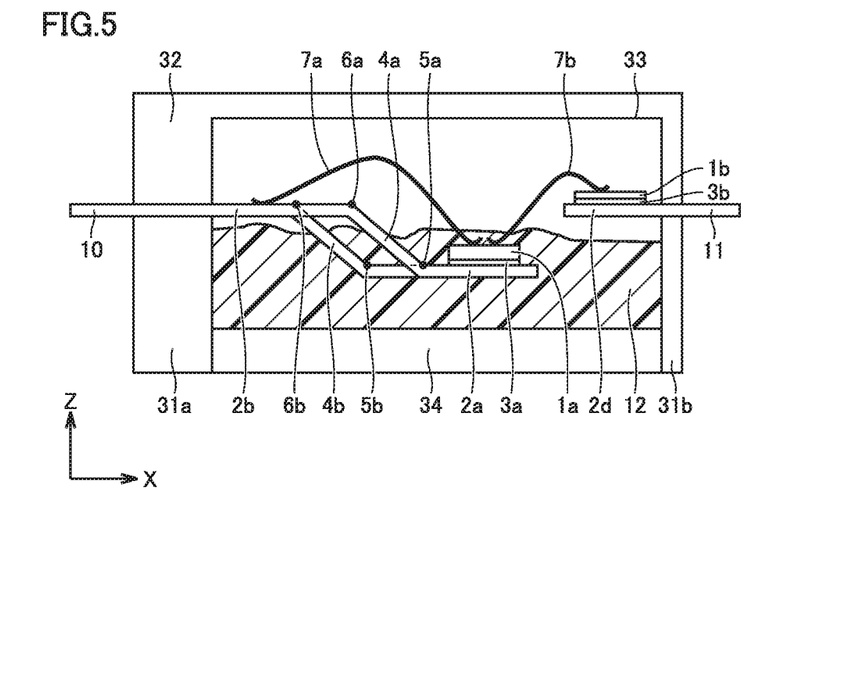
FIG. 5 is a front view showing a step of sealing components of the semiconductor device of Embodiment 1 by compression molding.

Molding resin 12 in the present embodiment seals semiconductor element 1, leadframe 2, and the like by transfer molding shown in FIG. 4 or compression molding shown in FIG. 5. Transfer molding will now be described with reference to FIG. 4.

With reference to FIG. 4, in the present embodiment, a workpiece obtained by bonding semiconductor elements 1a and 1b to, for example, die pad 2a and the main surface of independent frame 2d of leadframe 2 and electrically connecting the respective two regions by wire materials 7a and 7b is clamped with a lower die 21 and an upper die 22. In this clamping, for example, part of lead 10 connected to frame 2b and part of lead 11 connected to independent frame 2d preferably protrude outwardly of cavity 23 that is a region clamped with lower die 21 and upper die 22 to be finally sealed.

A molding resin is placed on a plunger 24, and plunger 24 is pushed upwardly in the Z direction. The molding resin on plunger 24 is thus pressurized and increases in fluidity. The molding resin flows through gate 25 while melting and reaches the inside of cavity 23. The molding resin flows so as to be divided into a molding resin 12a that flows at the upper side in the Z direction of die pad 2a and a molding resin 12b flowing at the lower side in the Z direction of die pad 2a in cavity 23. However, downstream of die pad 2a in the X direction, molding resin 12a and molding resin 12b meet, and these resins fill substantially the entire cavity 23 as molding resin 12. Since lower die 21 and upper die 22 are heated during this period, if the resin material for molding resin 12 is, for example, a thermosetting resin, molding resin 12 is cured by this heat, and semiconductor element 1 and the like are sealed with molding resin 12 which has been cured.

Compression molding will now be described with reference to FIG. 5. With reference to FIG. 5, a workpiece obtained by bonding semiconductor elements 1a and 1b to, for example, die pad 2a and the main surface of independent frame 2d of leadframe 2 and electrically connecting the two respective regions by wire materials 7a and 7b is clamped with lower dies 31a and 31b and an upper die 32. In this clamping, similarly to the above, part of lead 10 and part of lead 11 preferably protrude outwardly of cavity 33 that is a region clamped with lower dies 31a and 31b and upper die 32 to be finally sealed.

Then, a molding resin is placed on a cavity block 34, and cavity block 34 is pushed upwardly in the Z direction. The molding resin on plunger 24 is thus pressurized and increases in fluidity. The molding resin flows upwardly in the Z direction in cavity 33 while melting. Molding resin 12 thus fills substantially the entire cavity 33. Since lower dies 31a and 31b and upper die 32 are heated during this period, if the resin material for molding resin 12 is, for example, a thermosetting resin, molding resin 12 is cured by this heat, and semiconductor element 1 and the like are sealed with molding resin 12 which has been cured.

The function and effect of the present embodiment will now be described while describing the details, background, and the like of the present embodiment using a semiconductor device including leadframes according to a comparative example shown in FIGS. 6 to 9.

Figure 6:
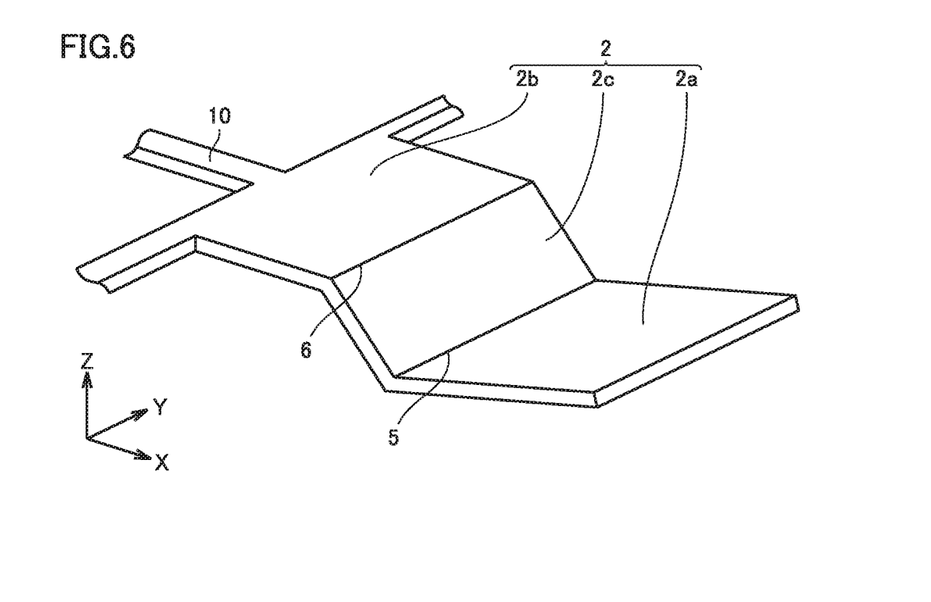
FIG. 6 is a schematic perspective view of a configuration of a leadframe of a comparative Example.
Figure 7:
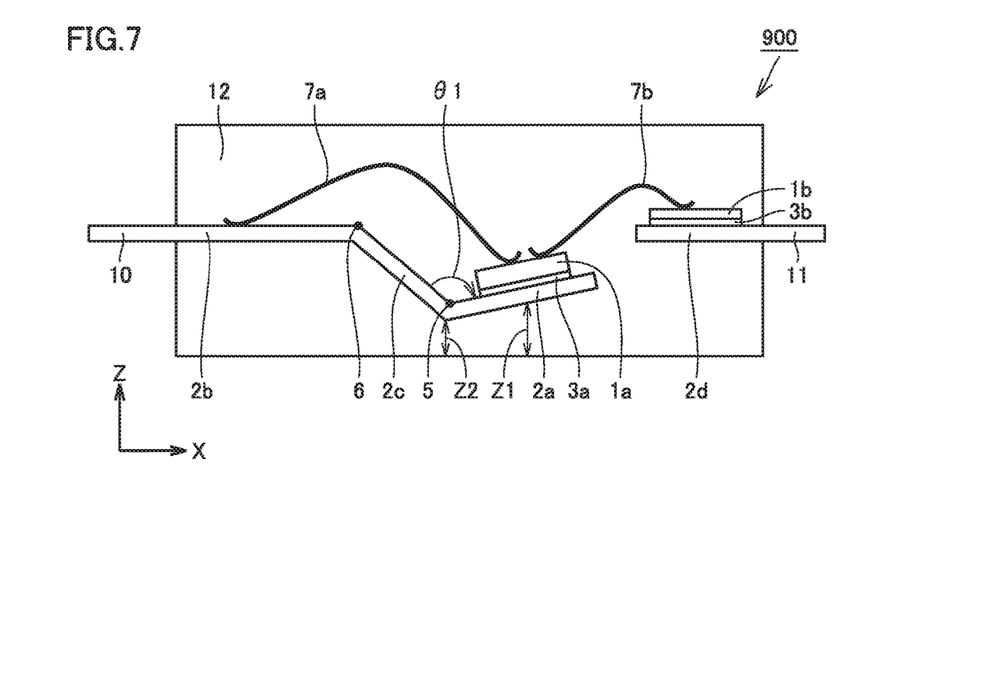
FIG. 7 is a front view of a general arrangement of a semiconductor device of the comparative example.
Figure 8:
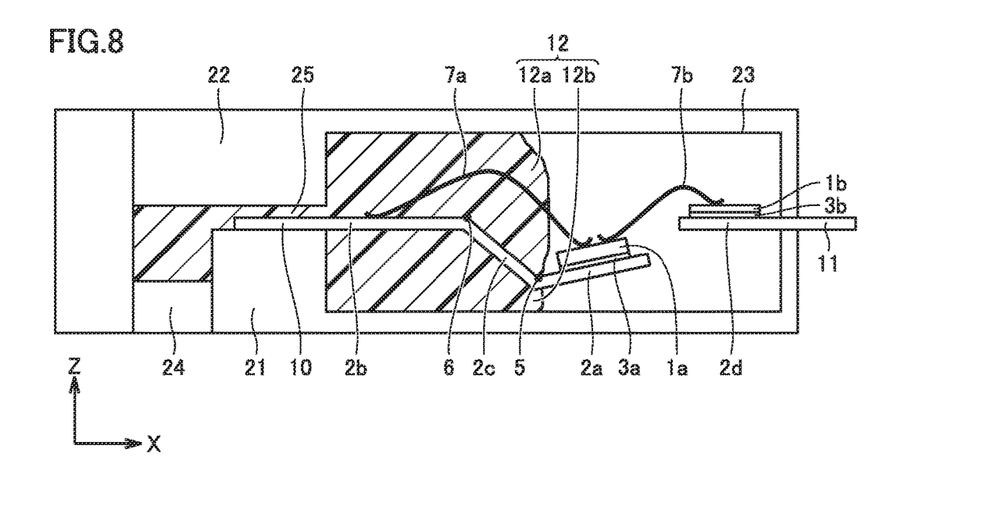
FIG. 8 is a front view showing a step of sealing components of the semiconductor device of the comparative example by transfer molding.

Although both of FIGS. 6 and 7 show the comparative example, they respectively correspond to FIGS. 2 and 3 of the present embodiment. With reference to FIGS. 6 and 7, a leadframe 2 of the comparative example includes a die pad 2a, a frame 2b, and a suspension lead 2c similarly to leadframe 2 of Embodiment 1. The same or similar components will thus be denoted by the same reference signs, and description thereof will not be repeated.

However, suspension lead 2c of leadframe 2 of the comparative example is not divided into a plurality of regions and is formed as a single region. In other words, suspension lead 2c is formed to have a dimension equal to the dimensions of die pad 2a and frame 2b in the Y direction. At boundary line 5 connecting die pad 2a and suspension lead 2c, leadframe 2 is bent so as to project downwardly in the Z direction in FIGS. 6 and 7 as in the case of boundary lines 5a to 5c of Embodiment 1. At boundary line 6 connecting suspension lead 2c and frame 2b, leadframe 2 is bent so as to project upwardly in the Z direction in FIGS. 6 and 7 as in the case of boundary lines 6a to 6c of Embodiment 1.

As shown in FIG. 7, a semiconductor device 900 including leadframe 2 as shown in FIG. 6 may cause a die pad shift in die pad 2a of leadframe 2. The die pad shift is a phenomenon in which the position of die pad 2a is shifted. In the die pad shift, for example, die pad 2a floats upward such that a distance Z1 in the Z direction from the central portion of die pad 2a in plan view on which semiconductor element 1a is mounted to the lowermost surface of molding resin 12 in the Z direction is greater than an original distance Z2 of die pad 2a from the lowermost surface of molding resin 12.

A die pad shift is caused by the deformation of leadframe 2 at boundary lines 5 and 6 of leadframe 2. Since the extreme end of die pad 2a particularly has the greatest bending moment, an angle θ1 formed between the main surfaces of die pad 2a and its adjacent suspension lead 2c is small due to a die pad shift. Consequently, distance Z1 is greater than distance Z2 in FIG. 7. The above is the description of the die pad shift.

A cause of the die pad shift resides in a resin sealing step by transfer molding and compression molding. In other words, with reference to FIG. 8, a difference is caused in the flow rate between molding resin 12a at the side upper than die pad 2a in the Z direction and molding resin 12b at the side lower than die pad 2a in the Z direction and molding resin 12b when the components of a semiconductor device including leadframe 2 of FIG. 6 is sealed with resin by transfer molding. The difference in flow rate leads to a difference between the flow resistance experienced by die pad 2a from molding resin 12a and the flow resistance experienced by die pad 2a from molding resin 12b. Specifically, especially in the case of a small distance from die pad 2a to the lowermost surface of molding resin 12 in the Z direction (a small thickness of this region), the force by which molding resin 12b begins to shift die pad 2a upwardly in the Z direction is greater than the force by which molding resin 12a begins to shift die pad 2a downwardly in the Z direction. A difference in the force exerted on die pad 2a by the molding resin due to the difference in flow resistance causes die pad 2a to experience the force upwardly in the Z direction, causing a die pad shift.

Figure 9:
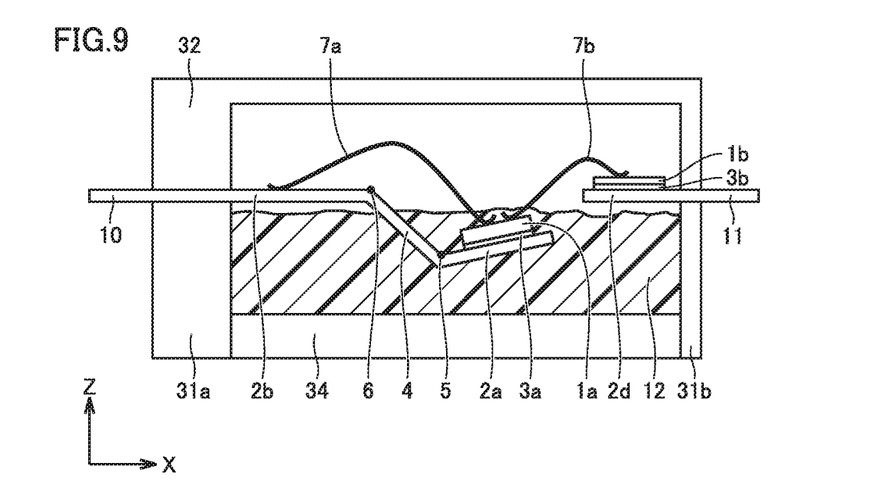
FIG. 9 is a front view showing a step of sealing components of the semiconductor device of the comparative example by compression molding.

With reference to FIG. 9, then, molding resin 12 flows from the lower side to the upper side in the Z direction when the components of the semiconductor device including leadframe 2 of FIG. 6 are sealed with resin by compression molding, and accordingly, die pad 2a experiences a high flow resistance upwardly. Die pad 2a thus experiences the force upwardly in the Z direction, causing a die pad shift.

Further, in the region filled with molding resin 12 at the side lower than die pad 2a in the Z direction, both functions, that is, heat dissipation from leadframe 2 to outside and insulation between leadframe 2 and outside, are required.

For such functions, the distance from die pad 2a to the lowermost surface of molding resin 12 in the Z direction is required to be large (thick) to some extent. However, if the horizontally with which the main surface of die pad 2a lies along the XY plane is lost due to a die pad shift, a difference between a thickness for maintaining heat dissipation properties in FIG. 7, or, Z1, and a thickness for maintaining insulation properties, or, Z2, becomes large. It is thus difficult to co-establish both functions, heat dissipation properties and insulation properties. Also in order to eliminate this problem, the occurrence of a die pad shift needs to be prevented or reduced.

In the present embodiment, thus, leadframe 2 has a configuration divided into suspension leads 4a and 4b. With this configuration, boundary line 5b between suspension lead 4b and die pad 2a runs on a straight line different from boundary line 5a between suspension lead 4a and die pad 2a, and boundary line 6b between suspension lead 4b and frame 2b runs on a straight line different from boundary line 6a between suspension lead 4a and frame 2b. This configuration allows suspension lead 4a and suspension lead 4b to be spaced from each other without lying on the same plane, as shown in FIG. 1.

Thus, if a force for reducing an angle corresponding to θ1 of FIG. 7 in suspension lead 4b is exerted, suspension lead 4a extending on a plane different from that of suspension lead 4b functions as a support strut that prevents or reduce a change of θ1. In other words, suspension lead 4b and suspension lead 4a extending on a plane different from that of suspension lead 4b leads to high rigidity of the entire suspension lead 2c compared with suspension lead 2c of the comparative example. This can reduce an amount of die pad shift against a flow resistance due to molding resin 12 by, for example, transfer molding.

In the present embodiment, even when a die pad shift begins to occur, die pad 2a is not located on the same two straight lines as boundary line 5a and boundary line 5b as shown in FIG. 3, and is supported by boundary lines, both of which are located on the main surface of die pad 2a and parallel to each other. The force for supporting die pad 2a can reduce the force by which boundary line 5a begins to float above boundary line 5b in the Z direction, thus maintaining a state in which die pad 2a is arranged horizontally so as to lie along the XY plane to some extent.

In the present embodiment, in leadframe 2, suspension lead 2c and frame 2b are arranged only at one side of the rectangular main surface of die pad 2a, that is, at the negative side of die pad 2a in the X direction and are not arranged at the other sides. This eliminates the need for making the overall size of semiconductor device 100 in plan view unnecessarily large compared with the case in which, for example, suspension lead 2c and frame 2b run from a plurality of directions (e.g., four directions) on the rectangular main surface of die pad 2a.

Since leadframe 2 of the present embodiment has a configuration in which suspension lead 2c and the like run from only one side on the rectangular main surface of die pad 2a and also has a configuration in which boundary lines 5a and 5b are parallel to each other as described above, leadframe 2 can be formed only by single bending.

In the present embodiment, leadframe 2 further includes suspension lead 4c, boundary line 5b between suspension lead 4b and die pad 2a runs on a straight line different from boundary line 5c between suspension lead 4c and die pad 2a, and boundary line 6b between suspension lead 4b and frame 2b runs on a straight line different from boundary line 6c between suspension lead 4c and frame 2b. Such a configuration causes suspension lead 4c and suspension lead 4b to be spaced from each other without lying on the same plane, as shown in FIG. 1. This causes suspension lead 4c to serve as a support strut that prevents or reduces the deformation due to a force for reducing an angle corresponding to θ1 of suspension lead 4b shown in FIG. 7, similarly to suspension lead 4a. The presence of suspension lead 4c can thus further increase the rigidity of the entire leadframe 2.

In the present embodiment, the shape of the entire leadframe 2 can be made resistant to deformation by causing suspension lead 4b and suspension lead 4a (and further suspension lead 4c) to have an equal length in their extension direction, thus preventing or reducing a die pad shift.

Embodiment 2

Figure 10:
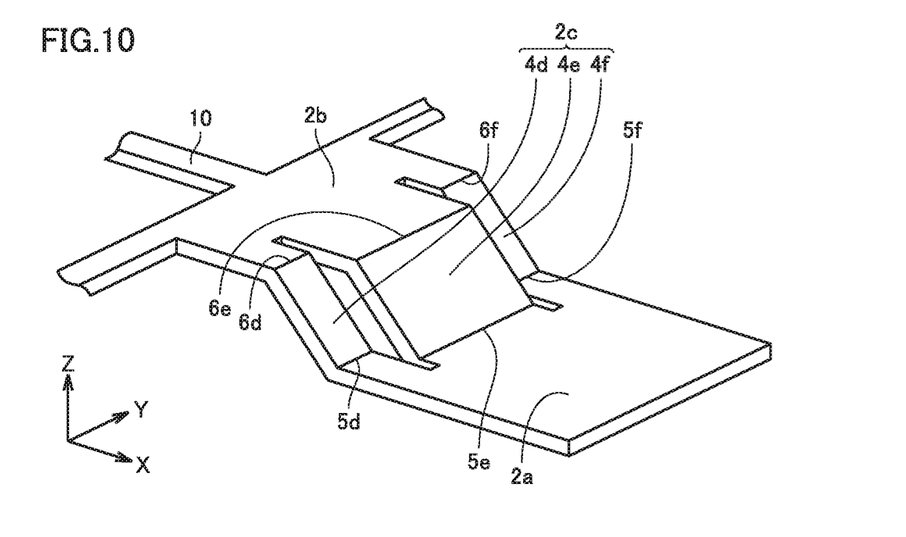
FIG. 10 is a schematic perspective view of a configuration of a leadframe of Embodiment 2.
Figure 11:
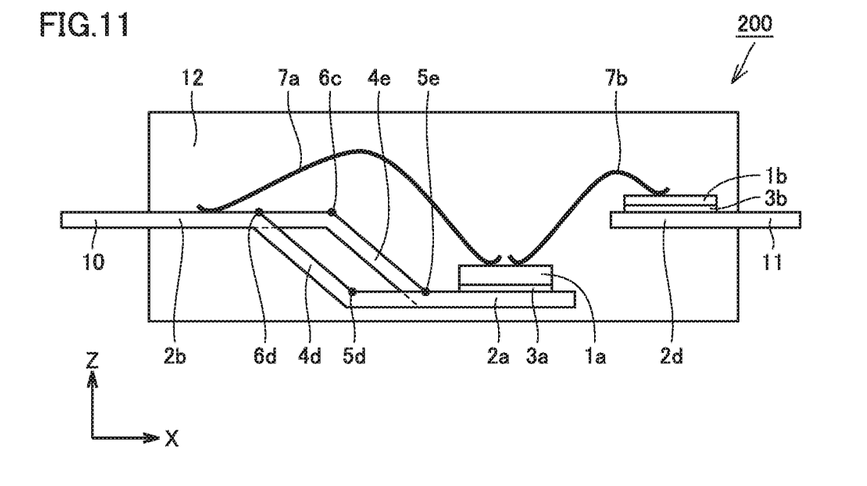
FIG. 11 is a front view of a general arrangement of a semiconductor device of Embodiment 2.

A leadframe 2 included in a semiconductor device 200 of the present embodiment will be described with reference to FIGS. 10 and 11. With reference to FIGS. 10 and 11, since leadframe 2 in semiconductor device 200 of the present embodiment basically has a configuration similar to that of leadframe 2 of semiconductor device 100 of Embodiment 1, the same or similar components will be denoted by the same reference signs, and description thereof will not be repeated.

In the present embodiment, however, suspension lead 2c is divided into three regions, namely, a suspension lead 4d (second suspension lead), a suspension lead 4e (first suspension lead), and a suspension lead 4f (third suspension lead), and these suspension leads are arranged so as to be disposed in the Z direction in the stated order. Suspension lead 4d of suspension lead 2c and die pad 2a are connected to each other by a boundary line 5d (second boundary line), suspension lead 4e of suspension lead 2c and die pad 2a are connected to each other by a boundary line 5e (first boundary line), and suspension lead 4f of suspension lead 2c and die pad 2a are connected to each other by a boundary line 5f (fifth boundary line). Suspension lead 4d and frame 2b are connected to each other by a boundary line 6d (fourth boundary line), suspension lead 4e and frame 2b are connected to each other by a boundary line 6e (third boundary line), and suspension lead 4f and frame 2b are connected by a boundary line 6f (sixth boundary line).

In other words, suspension leads 4d, 4e, and 4f of the present embodiment respectively correspond to suspension leads 4a, 4b, and 4c of Embodiment 1. Boundary lines 5d. 5e, and 5f of the present embodiment respectively correspond to boundary lines 5a, 5b, and 5c of Embodiment 1, and boundary lines 6d, 6e, and 6f of the present embodiment respectively correspond to boundary lines 6a, 6b, and 6c of Embodiment 1. Consequently, boundary lines 5d, 5e, and 5f are located on the main surface of die pad 2a, and boundary lines 6d, 6e, and 6f are located on the main surface of frame 2b.

In the present embodiment, although boundary line 5e and boundary line 5d run parallel to each other on different straight lines, boundary line 5e is located at the positive side (the front side in FIG. 10) in the X direction compared with boundary line 5d. Although boundary line 6e and boundary line 6d run parallel to each other on different straight lines, boundary line 6e is located at the positive side in the X direction compared with boundary line 6d. In the present embodiment, although boundary line 5f and boundary line 5e run parallel to each other on different straight lines, boundary line 5e is located at the positive side in the X direction compared with boundary line 5f. Although boundary line 6f and boundary line 6e run parallel to each other on different straight lines, boundary line 6e is located at the positive side in the X direction compared with boundary line 6f.

As described above, in FIG. 10 of the present embodiment, suspension lead 4e located at the center in the Y direction is located at the positive side in the X direction compared with suspension lead 4d and suspension lead 4f located at one side and the other side of suspension lead 4e in the Y direction. In the above respect, the present embodiment differs from Embodiment 1 in which the suspension leads and the boundary lines located except for at the center in the Y direction are located at the positive side in the X direction compared with the suspension lead and the boundary line located at the center in the Y direction.

The function and effect of the present embodiment will now be described. Since the function and effect of the present embodiment are basically similar to the function and effect of Embodiment 1, descriptions of the similar portions will be omitted. In addition, the present embodiment has the following function and effect.

In one conceivable example, die pad 2a of FIG. 2 of Embodiment 1 and die pad 2a of FIG. 10 of the present embodiment are equal in the dimension in the Y direction. In this case, die pad 2a of FIG. 2 can provide a larger area in die pad 2a on which semiconductor element 1 can be mounted than die pad 2a of FIG. 10 by an amount by which boundary line 5b at the center in the X direction is closer to the rear side in the X direction. However, considering a three-dimensional arrangement of wire material 7 connected to semiconductor element 1, it is assumed that leadframe 2 of the present embodiment is advantageous over leadframe 2 of Embodiment 1.

Embodiment 3

Figure 12:
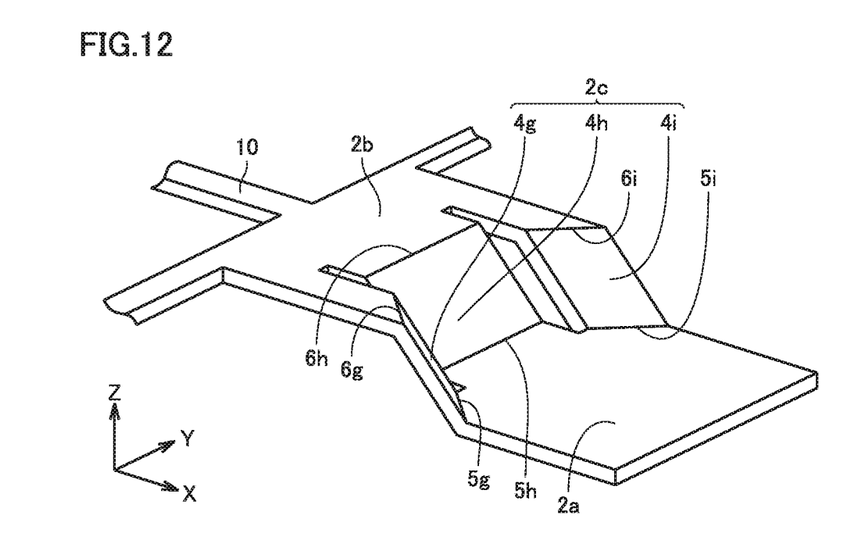
FIG. 12 is a schematic perspective view of a configuration of a leadframe of Embodiment 3.
Figure 13:
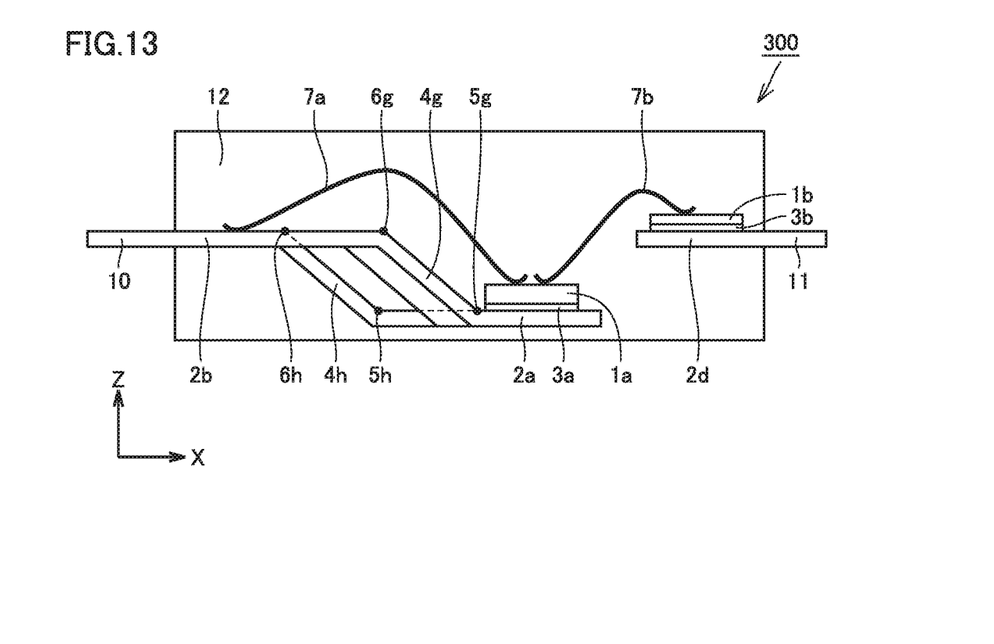
FIG. 13 is a front view of a general arrangement of a semiconductor device of Embodiment 3.

A leadframe 2 included in a semiconductor device 300 of the present embodiment will be described with reference to FIGS. 12 and 13. With reference to FIGS. 12 and 13, since leadframe 2 in semiconductor device 200 of the present embodiment basically has a configuration similar to that of leadframe 2 of semiconductor device 100 of Embodiment 1, the same or similar components will be denoted by the same reference signs, and description thereof will not be repeated.

In the present embodiment, however, suspension lead 2c is divided into three regions, namely, a suspension lead 4g (second suspension lead), a suspension lead 4h (first suspension lead), and a suspension lead 4i (third suspension lead), and these suspension leads are arranged so as to be disposed in the Z direction in the stated order. Suspension lead 4g of suspension lead 2c and die pad 2a are connected to each other by a boundary line 5g (second boundary line), suspension lead 4h of suspension lead 2c and die pad 2a are connected to each other by a boundary line 5h (first boundary line), and suspension lead 4i of suspension lead 2c and die pad 2a are connected to each other by a boundary line 5i (fifth boundary line). Suspension lead 4g and frame 2b are connected to each other by a boundary line 6g (fourth boundary line), suspension lead 4h and frame 2b are connected to each other by a boundary line 6h (third boundary line), and suspension lead 4i and frame 2b are connected to each other by a boundary line 6i (sixth boundary line).

In other words, suspension leads 4g, 4h, and 4i of the present embodiment respectively correspond to suspension leads 4a, 4b, and 4c of Embodiment 1. Boundary lines 5g, 5h, and 5i of the present embodiment respectively correspond to boundary lines 5a, 5b, and 5c of Embodiment 1, and boundary lines 6g, 6h, and 6i of the present embodiment respectively correspond to boundary lines 6a, 6b, and 6c of Embodiment 1. Thus, boundary lines 5g, 5h, and 5i are located on the main surface of die pad 2a, and boundary lines 6g, 6h, and 6i are located on the main surface of frame 2b.

In the present embodiment, an angle is provided between the main surface of suspension lead 4h and suspension lead 4g, specifically, an angle of 10° or more is provided. It should be noted that an angle of 45° or more is preferably provided therebetween. In the present embodiment, an angle is similarly provided between the main surface of suspension lead 4h and suspension lead 4i, specifically, an angle of 10° or more is provided. It should be noted that an angle of 45° or more is preferably provided therebetween.

In other words, the main surfaces of suspension lead 4g and suspension lead 4i are bent with respect to the main surface of suspension lead 4h in plan view. This results in boundary lines 5g and 5i bent with respect to boundary line 5h at a boundary portion between suspension lead 4h and suspension lead 4g and a boundary portion between suspension lead 4h and suspension lead 4i. Similarly, boundary lines 6g and 6i are bent with respect to boundary line 6h at a boundary portion between suspension lead 4h and suspension lead 4g and a boundary portion between suspension lead 4h and suspension lead 4i. Boundary line 5h and boundary lines 5g and 5i accordingly run on different straight lines. Boundary line 6h and boundary lines 6g and 6i run on different straight lines.

In this respect, the present embodiment differs from Embodiment 1 in which suspension lead 4b and suspension lead 4a are disposed parallel to each other, suspension lead 4b and suspension lead 4c are disposed parallel to each other, and an angle between these suspension leads is substantially 0°.

The function and effect of the present embodiment will now be described.

With the configuration in which an angle of, for example, 10° or more is provided between the main surfaces of suspension lead 4h and suspension lead 4g and between the main surfaces of suspension lead 4h and suspension lead 4i as in the present embodiment, the rigidity of the entire suspension lead 2c is much hither than with the configuration in which the main surfaces of these suspension leads are parallel to each other and an angle between these main surfaces thereof is substantially 0°. This leads to a much smaller amount of die pad shift against a flow resistance due to molding resin 12 by transfer molding than that of Embodiment 1.

Embodiment 4

Figure 14:
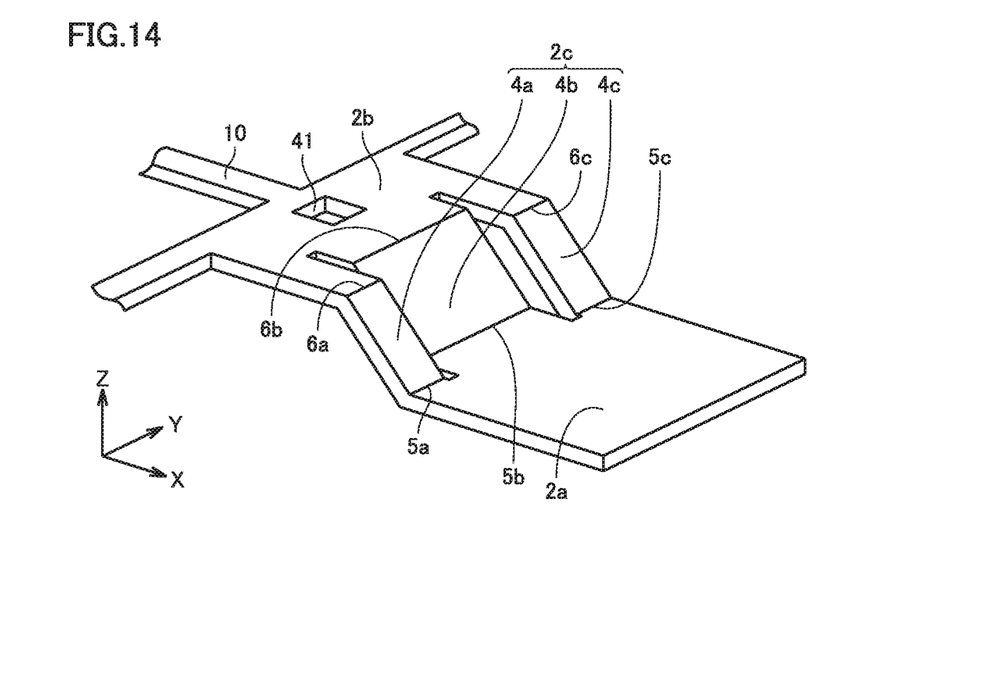
FIG. 14 is a schematic perspective view showing a first example of a configuration of a leadframe of Embodiment 4.
Figure 15:
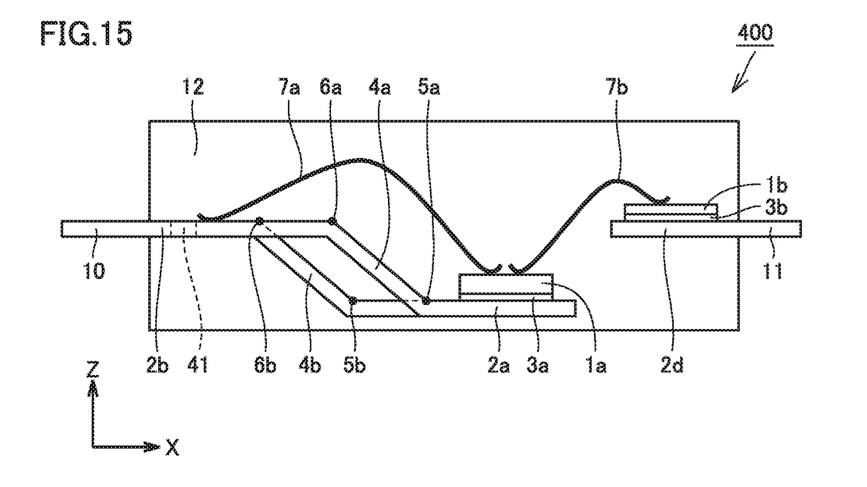
FIG. 15 is a front view of a general arrangement of a semiconductor device of Embodiment 4.

A leadframe 2 included in a semiconductor device 400 of the present embodiment will be described with reference to FIGS. 14 and 15. With reference to FIGS. 14 and 15, since frame 2 of semiconductor device 400 of the present embodiment basically has a configuration similar to that of leadframe 2 of semiconductor device 100 of Embodiment 1, the same or similar components will be denoted by the same reference signs, and description thereof will not be repeated.

Figure 16:
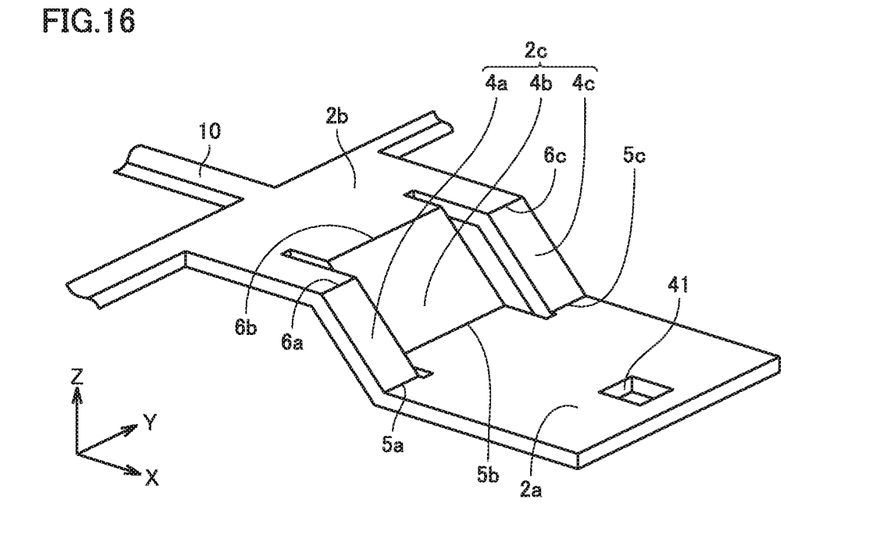
FIG. 16 is a schematic perspective view showing a second example of the configuration of the leadframe of Embodiment 4.

However, the present embodiment differs from Embodiment 1 in that a hole portion 41 is provided in part of the main surface of frame 2b. Hole portion 41 runs in a direction crossing the main surface and penetrates through the main surface. With reference to FIG. 16, hole portion 41 may be provided, for example, in part of the main surface of die pad 2a so as to run in a direction crossing the main surface and penetrate the main surface. The shape of hole portion 41 in plan view is not limited to a rectangular shape as shown in FIGS. 14 and 16 and may be any shape such as a circular shape.

The function and effect of the present embodiment will now be described. Since the function and effect of the present embodiment are basically similar to the function and effect of Embodiment 1, the description of similar portions will be omitted. In addition, the present embodiment has the following function and effect. In the present embodiment, hole portion 41 is provided that penetrates through frame 2b or the like so as to cross the main surface of frame 2b. This allows molding resin 12 to pass through hole portion 41 and flow from the lower side to the upper side of frame 2b in, for example, the Z direction when molding resin 12 is supplied into cavity 33 by, for example, compression molding (see FIG. 5). Since molding resin 12 can flow within hole portion 41 as described above, the upward force in the Z direction which is exerted on frame 2b by molding resin 12 is small compared with the case where hole portion 41 is not provided. This can further reduce a possibility that molding resin 12 will cause a die pad shift in leadframe 2 and also reduce the amount of die pad shift.

Embodiment 5

Figure 17:
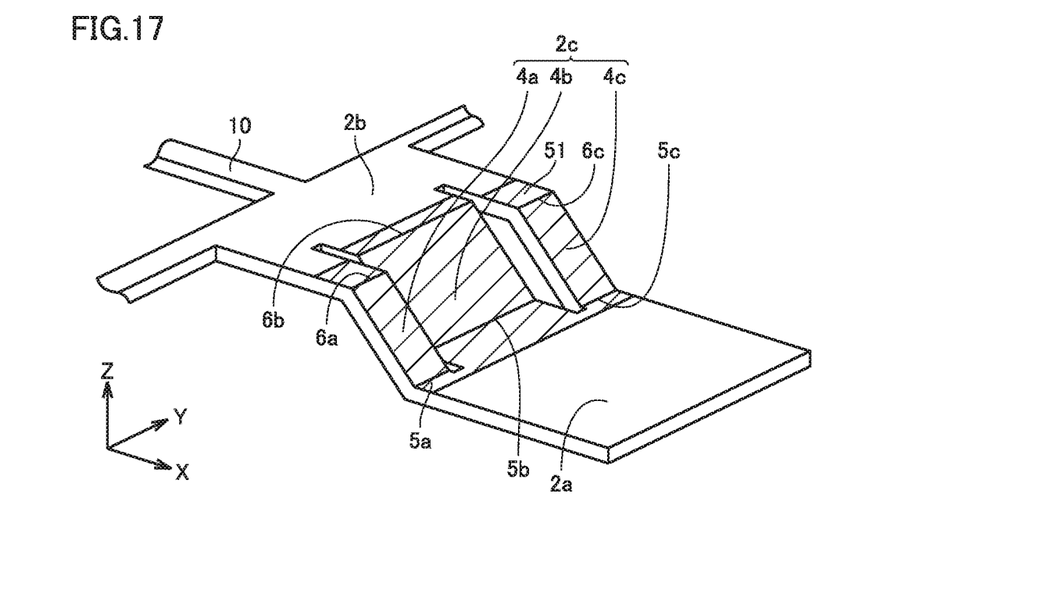
FIG. 17 is a schematic perspective view of a configuration of a leadframe of Embodiment 5.
Figure 18:
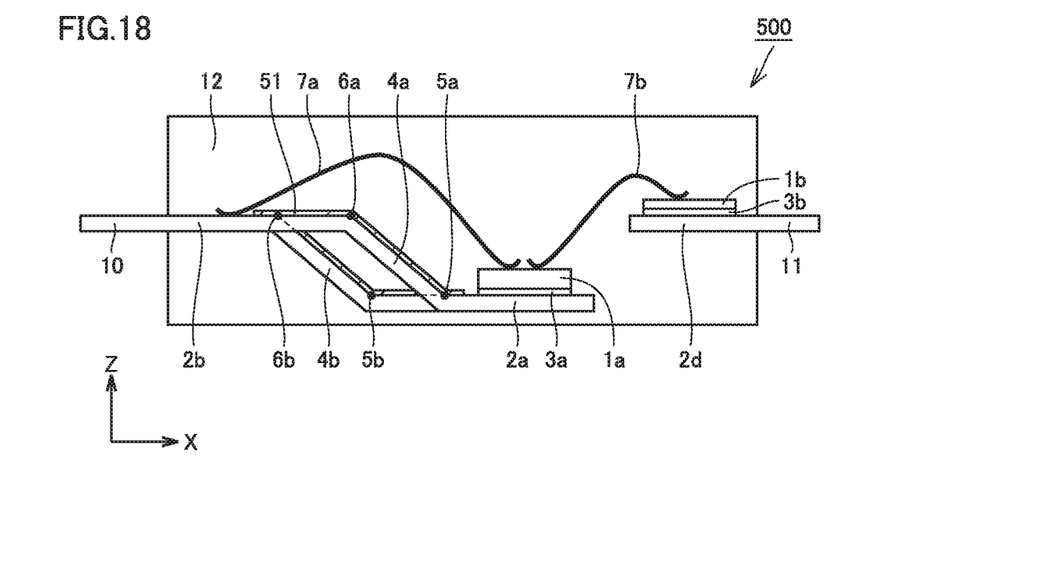
FIG. 18 is a front view of a general arrangement of a semiconductor device of Embodiment 5.

A leadframe 2 included in a semiconductor device 500 of the present embodiment will be described with reference to FIGS. 17 and 18. With reference to FIGS. 17 and 18, since leadframe 2 in semiconductor device 500 of the present embodiment basically has a configuration similar to that of leadframe 2 of semiconductor device 100 of Embodiment 1, the same or similar components will be denoted by the same reference signs, and description thereof will not be repeated.

In the present embodiment, however, at least part of suspension lead 2c is covered with a hard plating film 51. A non-limiting example of hard plating film 51 is a film that contains, for example, chromium, is relatively hard with Hv of 750 or more (in particular, Hv of 800 or more and 1000 or less, for example), and is formed by plating. Hard plating film 51 preferably has a thickness of 10 μm or more. Although hard plating film 51 is formed on the entire surfaces of suspension leads 4a, 4b, and 4c included in suspension lead 2c which face the positive side in the X direction in FIGS. 17 and 18, the present invention is not limited thereto. Alternatively, it suffices that hard plating film 51 is formed in at least part of the surfaces of suspension leads 4a, 4b, and 4c. Hard plating film 51 may also be formed in, for example, the region of frame 2b adjacent to the surfaces of suspension leads 4a, 4b, and 4c as shown in FIGS. 17 and 18, not only on the surfaces of suspension leads 4a, 4b, and 4c.

The function and effect of the present embodiment will now be described. Since the function and effect of the present embodiment are basically similar to the function and effect of Embodiment 1, description of similar portions will be omitted. In addition, the present embodiment has the following function and effect.

The rigidity of the entire suspension lead 2c is higher because of the formation of hard plating film 51 on suspension lead 2c in the present embodiment than in the case where hard plating film 51 is not formed. This can lead to a small amount of die pad shift against a flow resistance due to molding resin 12 by transfer molding compared with Embodiment 1.

Embodiment 6

A leadframe 2 of the present embodiment may have a configuration described below in addition to the above configurations.

Figure 19:
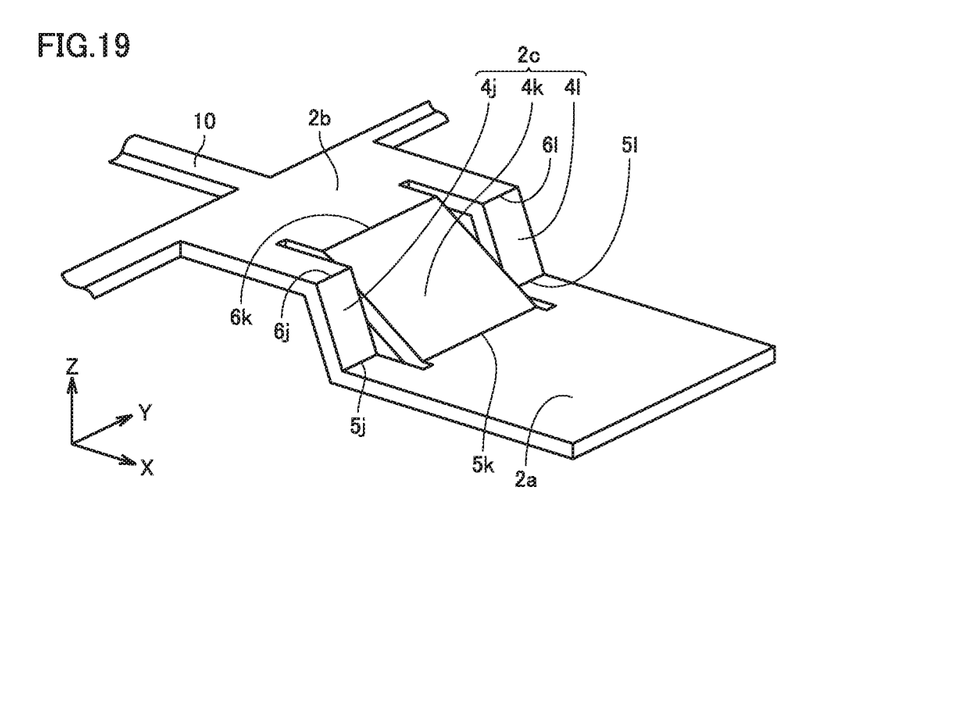
FIG. 19 is a schematic perspective view showing a first example of a configuration of a leadframe of Embodiment 6.
Figure 20:
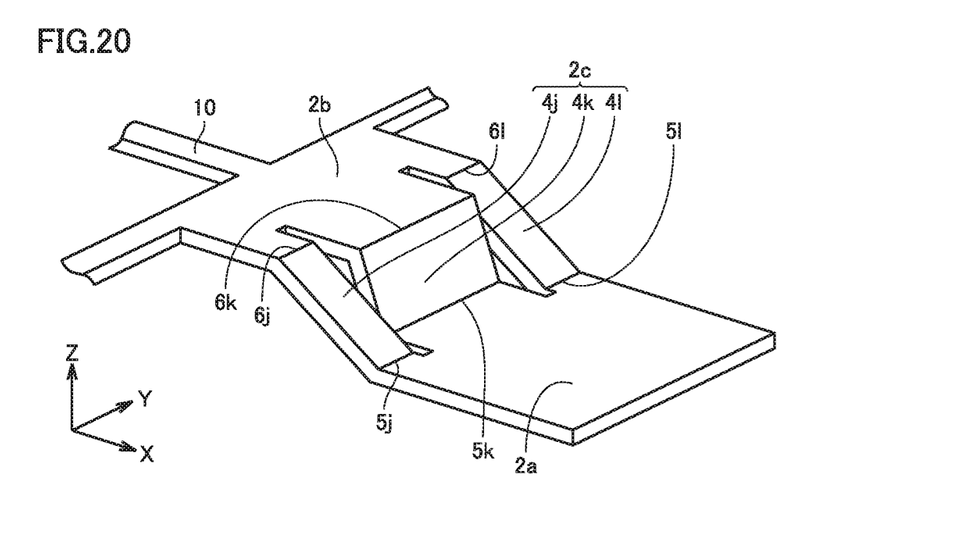
FIG. 20 is a schematic perspective view showing a second example of the configuration of the leadframe of Embodiment 6.

With reference to FIGS. 19 and 20, since leadframe 2 of the present embodiment basically has a configuration similar to that of leadframe 2 of semiconductor device 100 of Embodiment 1, the same or similar components will be denoted by the same reference signs, and description thereof will not be repeated. However, suspension leads 4j, 4k, and 4l of FIGS. 19 and 20 respectively correspond to suspension leads 4a, 4b, and 4c of Embodiment 1. Boundary lines 5j, 5k, and 5l of FIGS. 19 and 20 respectively correspond to boundary lines 5a, 5b, and 5c of Embodiment 1, and boundary lines 6j, 6k, and 6l of the present embodiment respectively correspond to boundary lines 6a, 6b, and 6c of Embodiment 1. Boundary line 5k runs on a straight line different from boundary lines 5j and 5l, and boundary lines 6k runs on a straight line different from boundary lines 6j and 6l. Boundary lines 5j, 5k, and 5l are located on the main surface of die pad 2a, and boundary lines 6j, 6k, and 6l are located on the main surface of frame 2b.

In FIG. 19, although boundary line 5k is located at the positive side in the X direction compared with boundary lines 5j and 5l, boundary line 6k is located at the negative side in the X direction compared with boundary lines 6j and 6l. Contrastingly, in FIG. 20, although boundary line 5k is located at the negative side in the X direction compared with boundary lines 5j and 5l, boundary line 6k is located at the positive side in the X direction compared with boundary lines 6j and 6l.

As described above, in the present embodiment, the anteroposterior relationship between each of a plurality of suspension leads and die pad 2a in the X direction of boundary lines 5j to 5l, and the anteroposterior relationship between each of a plurality of suspension leads and die pad 2a in the X direction of boundary lines 6j to 6l are reversed among a plurality of suspension leads 4j, 4k, and 4l. In this respect, the present embodiment differs from, for example. Embodiment 1 in which the anteroposterior relationships are identical among a plurality of suspension leads. Since the configuration of the present embodiment basically achieves the function and effect similar to those of Embodiment 1, detailed description of the function and effect will be omitted.

Although the respective embodiments describe examples in each of which suspension lead 2c is divided into three regions, any number of regions may be included in suspension lead 2c. In other words, for example, suspension lead 2c may be configured to be divided into only two regions or four or more regions, which is not shown herein.

Although, for example, the boundary line between suspension lead 2c and die pad 2a is divided into, for example, three regions and run on different straight lines as in the respective embodiments, the boundary line between suspension lead 2c and frame 2b may be configured similarly to boundary line 6 of FIG. 6 without being divided, which is not shown herein. Contrastingly, although, for example, the boundary line between suspension lead 2c and frame 2b is divided into three regions and run on different straight lines as in the respective embodiments, the boundary line between suspension lead 2c and die pad 2a may have a configuration similar to that of boundary line 6 of FIG. 6 without being divided, which is not shown herein.

The features of (the respective examples of) the respective embodiments described above can be applied in appropriate combination within the range where technically inconsistency does not occur.

It should be construed that the embodiments disclosed herein are given by way of illustration in all respects, not by way of limitation. It is intended that the scope of the present invention is defined by claims, not only by the description above, and encompasses all modifications and variations equivalent in meaning and scope to the claims.

REFERENCE SIGNS LIST 1,1a,1b semiconductor element, 2 leadframe, 2a die pad, 2b frame, 2c, 4a, 4b, 4c, 4d, 4e, 4f, 4g, 4h, 4i, 4j, 4k, 4l suspension lead, 2d independent frame, 3a, 3b conductive adhesive, 5, 5a, 5b, 5c, 5d, 5e, 5f, 5g, 5h, 5i, 5j, 5k, 5l, 6, 6a, 6b, 6c, 6d, 6e, 6f, 6g, 6h, 6i, 6j, 6k, 6l boundary line, 7, 7a, 7b wire material, 8 terminal, 10, 11 lead, 12, 12a, 12b molding resin, 21, 31a, 31b lower die, 22, 32 upper die, 23, 33 cavity, 24 plunger, 25 gate, 34 cavity block, 41 hole portion, 100, 200, 300, 400, 500, 900 semiconductor device.

The invention claimed is:

1. A semiconductor device comprising:
   a semiconductor element; and
   a leadframe on which the semiconductor element is mounted,
   the leadframe including a die pad on which the semiconductor element is mounted, a first suspension lead, a second suspension lead, and a frame, a main surface of the die pad and a main surface of the frame being located on different planes, the die pad and the frame being connected to each other by the first and second suspension leads,
   a first boundary line between the first suspension lead and the die pad running on a straight line different from a second boundary line between the second suspension lead and the die pad,
   a third boundary line between the first suspension lead and the frame running on a straight line different from a fourth boundary line between the second suspension lead and the frame.

2. The semiconductor device according to claim 1, wherein
   in the leadframe, the first suspension lead, the second suspension lead, and the frame are located at one side on the main surface of the die pad,
   the first boundary line and the second boundary line are located on the main surface of the die pad, and
   the third boundary line and the fourth boundary line are located on the main surface of the frame.

3. The semiconductor device according to claim 1, wherein
   the first boundary line and the second boundary line are parallel to each other, and
   the third boundary line and the fourth boundary line are parallel to each other.

4. The semiconductor device according to claim 1, wherein
   the leadframe includes a third suspension lead,
   the first boundary line between the first suspension lead and the die pad runs on a straight line different from a fifth boundary line between the third suspension lead and the die pad, and
   the third boundary line between the first suspension lead and the frame runs on a straight line different from a sixth boundary line between the third suspension lead and the frame.

5. The semiconductor device according to claim 4, wherein a main surface of the first suspension lead and a main surface of the second suspension lead form an angle of 10° or more, and the main surface of the first suspension lead and a main surface of the third suspension lead form an angle of 10° or more.

6. The semiconductor device according to claim 1, wherein the first and second suspension leads have an equal length in a direction in which the first and second suspension leads run.

7. The semiconductor device according to claim 1, wherein a hole portion penetrating the main surface of the frame or the main surface of the die pad is provided in part of the main surface.

8. The semiconductor device according to claim 4, wherein at least part of the first, second, and third suspension leads are covered with a hard plating film.

\* \* \* \* \*